United States Patent
Brady et al.

(10) Patent No.: US 6,794,733 B1
(45) Date of Patent: Sep. 21, 2004

(54) INCREASING THE SUSCEPTABILITY OF AN INTEGRATED CIRCUIT TO IONIZING RADIATION

(75) Inventors: Frederick T. Brady, San Antonio, TX (US); Murty S. Polavarapu, Vienna, VA (US)

(73) Assignee: BAE Systems, Nashua, NH (US)

( * ) Notice: Subject to any disclaimer, the term of this patent is extended or adjusted under 35 U.S.C. 154(b) by 213 days.

(21) Appl. No.: 09/590,805

(22) Filed: Jun. 9, 2000

Related U.S. Application Data (60) Provisional application No. 60/138,718, filed on Jun. 11, 1999.

(51) Int. Cl.[7] .............................................. H01L 23/58
(52) U.S. Cl. ........................ 257/645; 257/635; 257/921
(58) Field of Search ................................ 257/610, 611, 257/629, 632, 635, 645, 646, 921

(56) References Cited

U.S. PATENT DOCUMENTS

| | | | |
|---|---|---|---|
| 4,144,490 A | * 3/1979 | Stevens | 324/78 |
| 5,294,843 A | * 3/1994 | Tursky et al. | 257/611 |
| 5,589,708 A | * 12/1996 | Kalnitsky | 257/646 |
| 5,748,412 A | * 5/1998 | Murdock et al. | 360/113 |

FOREIGN PATENT DOCUMENTS

| | | | | |
|---|---|---|---|---|
| DE | 3709989 | * 10/1988 | | H02M/3/10 |

* cited by examiner

*Primary Examiner*—Ori Nadav
(74) *Attorney, Agent, or Firm*—DeMont & Breyer, LLC (57) ABSTRACT

In integrated circuit that yields the advantages of contemporary processing technologies and yet is irreparably damaged by ionizing radiation. An integrated circuit is designed and fabricated with contemporary processing technologies in well-known fashion, except that certain devices, called "safeguard" devices, are added to the integrated circuit. The safeguard devices are fabricated so that they, and not the other devices on the integrated circuit, are susceptible to ionizing radiation. Furthermore, the safeguard devices are coupled to the utile devices on the integrated circuit in such a manner than when the integrated circuit is bombarded with ionizing radiation the safeguard devices short and destroy the functionality of the utile devices, and, therefore, the functionality of the integrated circuit.

9 Claims, 7 Drawing Sheets

INCREASING THE SUSCEPTABILITY OF AN INTEGRATED CIRCUIT TO IONIZING RADIATION

CROSS-REFERENCE TO RELATED APPLICATIONS

This application claims the benefit of U.S. Provisional Application No. 60/138,718, filed Jun. 11, 1999, which is incorporated by reference.

FIELD OF THE INVENTION

The present invention relates to semiconductor processing and integrated circuits in general, and, more particularly, to integrated circuits that are susceptible to ionizing radiation.

BACKGROUND OF THE INVENTION

As is well known in the prior art, older semiconductor processing technologies produced integrated circuits that were highly susceptible to damage from ionizing radiation. Such ionizing radiation is emitted from galactic sources (e.g., the Sun, stars, pulsars, quasars, black holes, etc.) and exists above the ionosphere. Ionizing radiation is also emitted when nuclear weapons are detonated.

The mechanism by which ionizing radiation affects the electrical characteristics of CMOS and NMOS transistors and other semiconductor devices is described in detail below in conjunction with FIGS. 1A through 1C. A summary of the mechanism is as follows.

Under normal operating conditions, the threshold voltage, $V_T$, of an n-type transistor is normally and advantageously high. When an n-type transistor is exposed to ionizing radiation, the ionizing radiation causes the threshold voltage, $V_T$, of the transistor to fall, which can cause the transistor to operate abnormally. If an n-type transistor is exposed to a sufficiently large total dose of ionizing radiation, then the threshold voltage can fall so low that the transistor continuously conducts current between the source and drain. This causes the transistor to fail completely and typically destroys the operation of the integrated circuit of which it is a part.

A detailed understanding of the mechanism by which ionizing radiation affects CMOS and NMOS transistors requires and understanding of the physical and electrical structure of an n-type transistor.

Figure 1A:
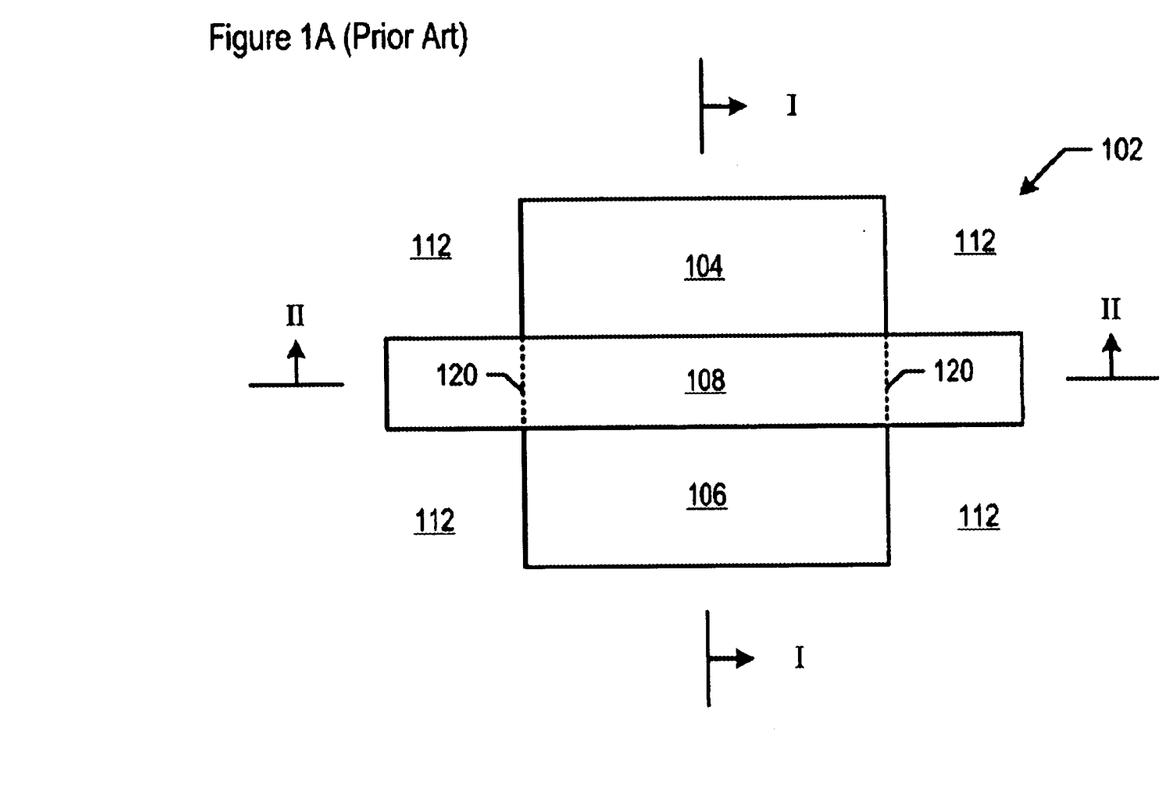
FIGS. 1A through 1C depict a field-effect transistor in the prior art.
Figure 1B:
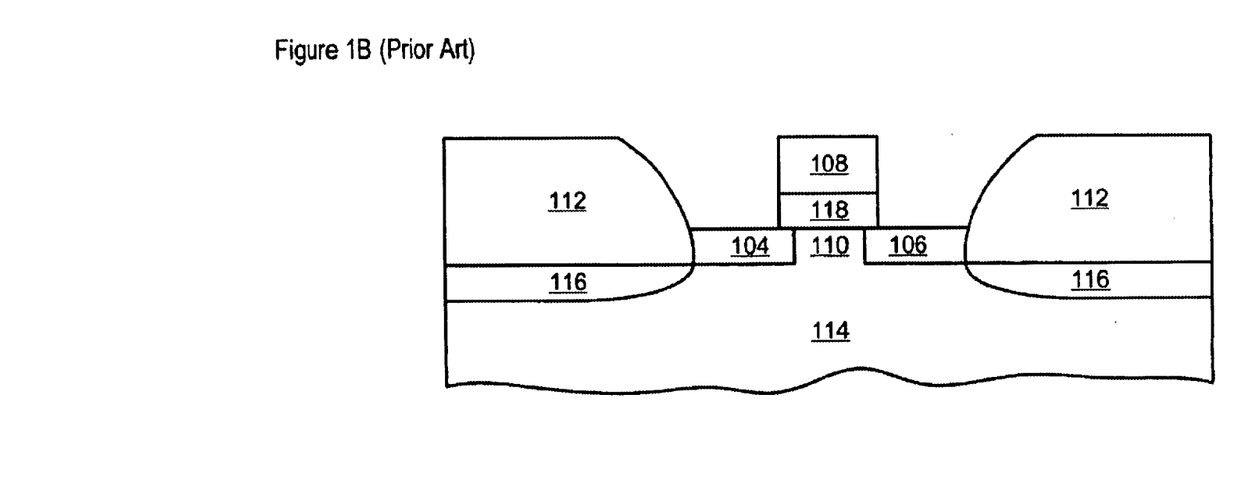
Figure 1C:
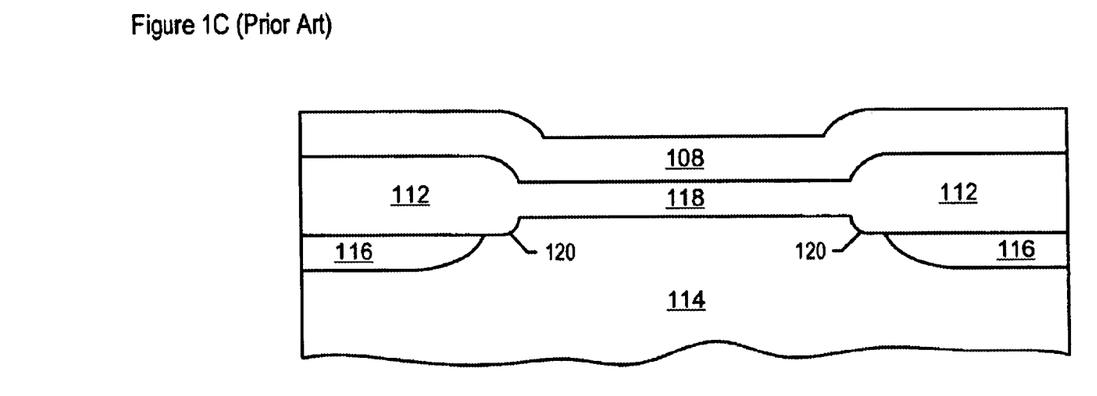

An n-type transistor, such as that depicted in FIGS. 1A through 1C, comprises two distinct "transistors" that are electrically in parallel: (1) an "operating" transistor, and (2) a "parasitic" transistor.

The operating transistor is the intended ideal structure for regulating the flow of current between the source and drain. The parasitic transistor is an unintended, but real transistor structure that results from artifacts in the manufacture of the operating transistor and from the fact that the materials used to build the operating transistor do not function perfectly. The operating transistor and the parasitic transistor each have their own threshold voltage, $V_T$. Because the operating transistor and the parasitic transistor are in parallel, the one with the lower threshold voltage, $V_T$, is the one that effectively overrules the operation of the other. For the purposes of this specification, the "effective threshold voltage" of a transistor is defined as the lower of (i) its operating transistor's threshold voltage and (ii) its parasitic transistor's threshold voltage.

Under normal operating conditions, the threshold voltage of the parasitic transistor is higher than the threshold voltage of the operating transistor, and, therefore, the current flow between the source and the drain is regulated by the operating transistor. This is the desired condition.

In contrast, when the transistor has been exposed to a high dose of ionizing radiation, the threshold voltage of the parasitic transistor can fall below that of the operating transistor. In fact, the threshold voltage of the parasitic transistor can fall so low that it becomes a "closed" circuit, which effectively shorts the source and drain regardless of the state of the operating transistor. This is the abnormal condition. As stated above, when the source and drain are effectively shorted together regardless of the state of the operating transistor, the transistor fails completely and most likely destroys the operation of the integrated circuit of which it is a part.

FIG. 1A depicts a plan view of n-type transistor 102, which comprises: n-type drain region 104, n-type source region 106, and gate electrode 108, (e.g., polysilicon, etc.). Drain region 104 and source region 106 are bounded by field oxide 112, (e.g., silicon dioxide, etc.), which help electrically isolate transistor 102 from other transistors that might be near it (and are not shown in FIG. 1A).

FIG. 1B is a cross-section of transistor 102 along line I—I (as shown in FIG. 1A) as viewed in the direction indicated and depicts the germane portions of the operating transistor. The operating transistor comprises: gate electrode 108 which overlies gate dielectric 118 and channel region 110 in p-type substrate 114 between drain region 104 and source region 106.

FIG. 1C is a cross-section of transistor 102 along line II—II (as shown in FIG. 1A) as viewed in the direction indicated and depicts the germane portions of the parasitic transistor. The parasitic transistor comprises: gate electrode 108 which overlies field oxide 112/p-type substrate 114 at regions 120, wherein field oxide 112 forms a shape similar to a bird's beak. Typically, p-type regions 116 are more heavily-doped than substrate 114 to increase the threshold voltage of the parasitic transistor, which is advantageous because it helps to ensure that the threshold voltage of the operating transistor is higher than the threshold voltage of the parasitic transistor.

As stated above, the exposure of an n-type transistor to ionizing radiation can change the threshold voltage, $V_T$, of both the operating transistor and the parasitic transistor. The threshold voltage, $V_T$, of either is theoretically predicted by the following equation:

$$V_T = \phi - (\sigma/\epsilon)d - F \qquad (Eq. 1)$$

where: $\phi$ is the work function of the gate region; $\sigma$ is the total charge at the dielectric(insulator)-semiconductor interface; $\epsilon$ is the dielectric constant of the insulator; d is the insulator thickness; and F is a term that can be considered a constant.

If, somehow, positive interface charge, $\sigma$, is added at the dielectric(insulator)-semiconductor interface, then the threshold voltage, $V_T$, decreases. One way of adding positive interface charge, $\sigma$, to the device is to expose it to ionizing radiation. It can be seen from Equation 1 that with a sufficient increase in the positive interface charge, $\sigma$, an n-type transistor can have an effective threshold voltage, $V_T$, of zero.

When an n-type transistor is exposed to ionizing radiation, electron-hole pairs are formed in the gate dielectric and the field oxide. Some of the holes become trapped in the gate dielectric and field oxide as various gate-induced fields sweep out the electrons as part of normal circuit operation. Because holes behave like positive charge, this phenomenon is referred to as positive-charge trapping.

Although the electrons are swept out of the circuit, the trapped "positive" charges migrate toward the dielectric (insulator)-semiconductor interface, which adds positive interface charge, σ, and decreases the effective threshold voltage, $V_T$, of the transistor.

Because the field oxide traps more positive charge than the gate dielectric, and because the threshold voltage decreases as the positive interface charge increases, the threshold voltage of the parasitic transistor at regions 120 will therefore shift downwardly more than will the threshold voltage of the operating transistor (i.e., the transistor having gate dielectric 118) when exposed to the same amount of ionizing radiation. If the dose of radiation is sufficiently great, the parasitic transistor will conduct at regions 120 (i.e., under the edge of field oxide 112) when the operating transistor normally conducts. Therefore, the parasitic transistor is more susceptible to ionizing radiation than is the operating transistor.

The important consequence of the susceptibility of integrated circuits to ionizing radiation is that they are not well suited for use in satellites or in military applications, and, therefore, they can be freely sold and exported without creating the fear that they can be used militarily against the United States or its allies.

In contrast, some state-of-the-art semiconductor processing technologies produce integrated circuits whose operating transistors and parasitic transistors are inherently highly tolerant to damage from ionizing radiation. The reason is because the smaller feature sizes of contemporary semiconductor processing technologies trap fewer positive charges than the larger feature sizes of older processing technologies.

Although the relatively high radiation tolerance of state-of-the-art integrated circuits is of no benefit to most users and for most applications, it makes the circuits suitable for use in aerospace and military applications. This, of course, justifies the fear that they could be used militarily against the United States or its allies, and so the Department of Defense export restrictions (ITAR) might prevent those chips from being freely sold or exported. To the extent that a commercial CMOS or NMOS fabricator is restricted by ITAR from freely selling or exporting chips that have a legitimate non-military use, it suffers financially.

Therefore, the need exists for a technique that increases the susceptibility of integrated circuits to ionizing radiation, but that retains the other advantages that accrue from contemporary processing methods.

SUMMARY OF THE INVENTION

Some embodiments of the present invention provide integrated circuits that have increased susceptibility to ionizing radiation without the costs and disadvantages of techniques in the prior art. In particular, the illustrative embodiment of the present invention is an integrated circuit that possesses the benefits of contemporary processing technologies (e.g., small feature size, etc.) yet is advantageously irreparably damaged by ionizing radiation. Thus, some integrated circuits made in accordance with the present teachings can be freely sold and exported without creating the justifiable fear that they can be used militarily against the United States or its allies.

In accordance with the illustrative embodiment of the present invention, an integrated circuit is designed and fabricated with contemporary processing technologies in well-known fashion, except that certain devices, called "safeguard" devices, are added to the integrated circuit. The safeguard devices are fabricated so that they, and not the other devices on the integrated circuit, are susceptible to ionizing radiation. Furthermore, the safeguard devices are coupled into the logic of the integrated circuit in such a manner than when the integrated circuit is bombarded with ionizing radiation the safeguard devices irreparably destroy the functionality of the integrated circuit.

In general, the safeguard devices can destroy the functionality of the integrated circuits in two ways. First, one or more safeguard devices can interfere with the logical operation of an integrated circuit by, for example, shorting a signal lead to ground. This, of course, interferes with the logical operation of the integrated circuit.

Second, one or more safeguard devices can interfere with the electrical operation of an integrated circuit by, for example, shorting $V_{DD}$ to ground. This technique works, of course, by depriving the utile devices on the integrated circuit of electrical power.

The first illustrative embodiment of the present invention is an integrated circuit comprising: a first device comprising a first lead, a second lead, and a third lead, wherein the third lead of the first device is electrically connected to ground; and a second device comprising a first lead, a second lead, and a third lead, wherein the third lead of the second device is electrically connected to ground; wherein the effective threshold voltage of the first device is more susceptible to be lowered by ionizing radiation than is the effective threshold voltage of the second device.

In a first variation of the first illustrative embodiment, the integrated circuit wherein the first device comprises an n-type metal-oxide semiconductor field-effect transistor.

In a second variation of the first illustrative embodiment, the first device comprises a field oxide that has been implanted with a material that traps positive charge when the first device is exposed to ionizing radiation and the second device has not been implanted with the material.

In a third variation of the first illustrative embodiment, the integrated circuit comprises a microprocessor that comprises a control sequencer and arithmetic logic unit.

In a fourth variation of the first illustrative embodiment, the integrated circuit comprises a plurality of memory cells.

In a fifth variation of the first illustrative embodiment, the second lead of the first device is connected to ground, the third lead of the first device is connected to power, and the third lead of the second device is connected to power.

In a sixth variation of the first illustrative embodiment, the first device shorts power to ground when the device has been exposed to ionizing radiation.

The second illustrative embodiment of the present invention is an integrated circuit comprising: a first device comprising a first lead, a second lead, and a third lead, wherein the third lead of the first device is electrically connected to ground; and a second device comprising a first lead, a second lead, and a third lead, wherein the third lead of the second device is electrically connected to ground; wherein at least a portion of the first device comprises a higher concentration of positive charge trapping centers than the second device.

In a first variation of the second illustrative embodiment, the first device comprises an n-type metal-oxide semiconductor field-effect transistor.

In a second variation of the second illustrative embodiment, the integrated circuit comprises a microprocessor that comprises a control sequencer and arithmetic logic unit.

The third illustrative embodiment of the present invention is a method comprising: fabricating a base layer comprising a first device having a first lead and a second lead, and a second device having a first lead that is electrically connected to the first lead of the first device; implanting at least a portion of the first device with a material that traps positive charge when the first device is exposed to ionizing radiation; and preventing the second device from being implanted with the material.

In a first variation of the third illustrative embodiment, the first device comprises an n-type metal-oxide semiconductor field-effect transistor.

In a second variation of the third illustrative embodiment, there is a field oxide in an isolation region associated with the first device is implanted with the material.

The third variation of the third illustrative embodiment further comprises masking the base layer with a resist to protect the second device from being implanted with the material and to expose the first device to being implanted with the material.

The fourth illustrative embodiment of the present invention is a method comprising: fabricating a base layer comprising a first device having a first lead and a second lead, and a second device having a first lead that is electrically connected to the first lead of the first device; masking the base layer with a resist to protect the second device from an implantation that traps positive charge when the second device is exposed to ionizing radiation, and to expose the first device to the implantation; and implanting at least a portion of the first device with the implantation.

In a first variation of the fourth illustrative embodiment, the first device comprises an n-type metal-oxide semiconductor field-effect transistor.

In a second variation of the fourth illustrative embodiment, there is a field oxide in an isolation region associated with the first device is implanted with the material.

The fifth illustrative embodiment of the present invention is a method of operating an integrated circuit, the method comprising: processing signals with a first device; and interfering with the operation of the first device with a second device when and only when the integrated circuit is exposed to ionizing radiation.

In a first variation of the fifth illustrative embodiment, the exposure of the integrated circuit to ionizing radiation shorts an output of the first device to ground through the second device.

In a second variation of the fifth illustrative embodiment, at least a portion of the second device comprises an implant that facilitates the trapping of positive charge when exposed to ionizing radiation that the first device does not comprise.

In a third variation of the fifth illustrative embodiment, the exposure of the integrated circuit to ionizing radiation disables the operation of the integrated circuit.

DETAILED DESCRIPTION

Figure 2:
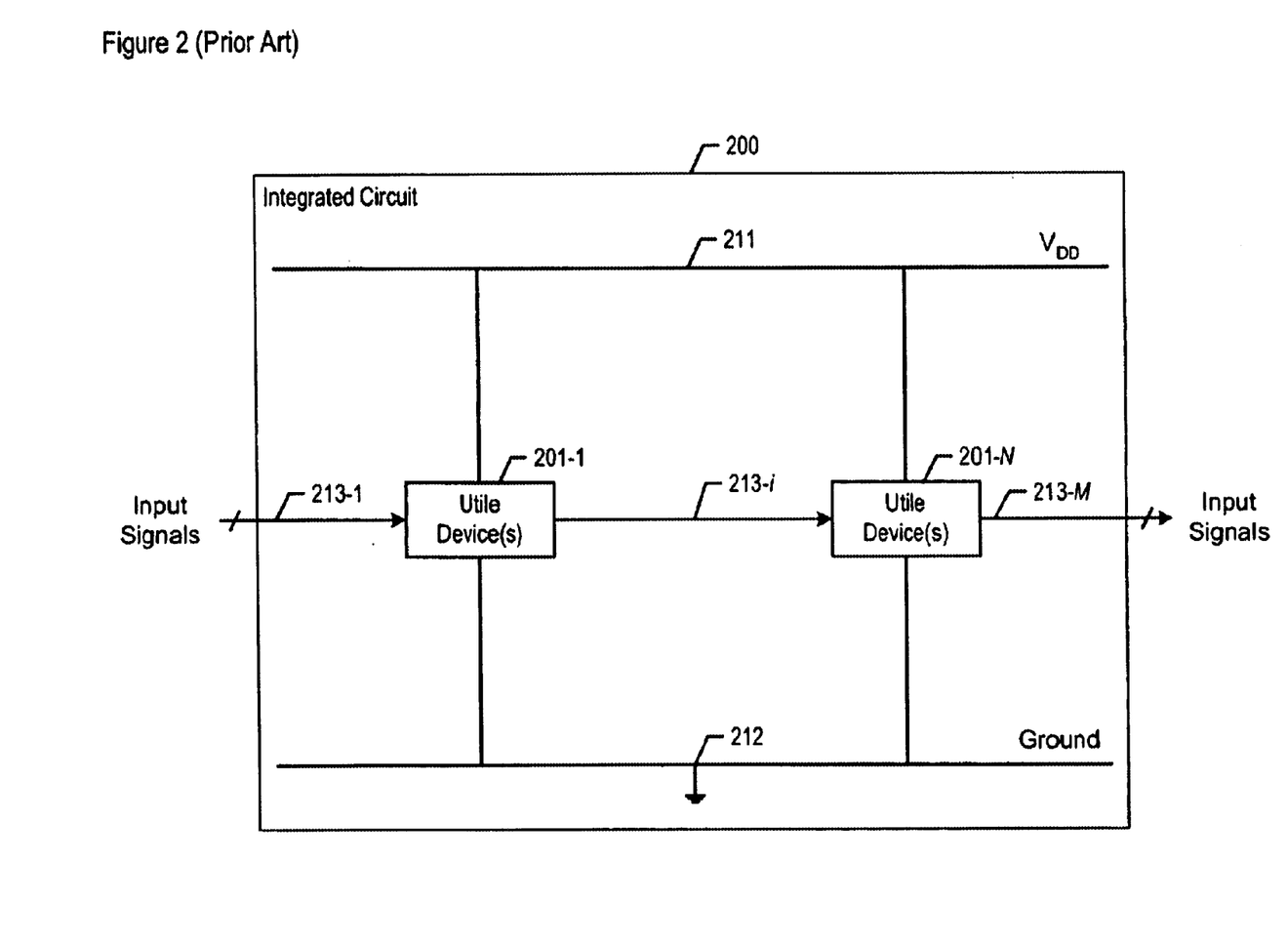
FIG. 2 depicts a block diagram of an integrated circuit in the prior art.

FIG. 2 depicts a block diagram of integrated circuit 200 in the prior art, which typically comprises a plurality of utile devices, utile devices 201-1 through 201-N, electrical conductors 211 for connecting utile devices 201-1 through 201-N to power, and electrical conductor 212 for connecting utile devices 201-1 through 201-N to ground. It will be clear to those skilled in the art that integrated circuits typically comprise many other elements (e.g., pads for receiving power and ground, etc.) than are depicted in FIG. 2, but these are not shown so that attention can be focused on those elements that are germane to an understanding of the present invention.

For the purposes of this specification, a "device" is defined as a transistor (i.e., both the operating transistor and a parasitic transistor, if one exists) and the surrounding materials (e.g., the field oxide, the gate dielectric, etc.) that affect the operating parameters (e.g., the effective threshold voltage, $V_T$, etc.) of the transistor.

For the purposes of this specification, a "utile device" is defined as a device that processes an information-bearing signal. Utile devices can be operate in either analog mode or digital mode or both. Typically, the utile devices on an integrated circuit provide the functionality for which the circuit was designed and fabricated and utilized. For example, the utile devices on an integrated circuit might function as a microprocessor with a control sequencer and an arithmetic logic unit, a plurality of memory cells, an amplifier, etc.

As shown in FIG. 2, utile devices typically have: (i) input signals, which might be received from off of integrated circuit 200 or that might be generated by other utile devices, and (ii) output signals, which might be sent off of integrated circuit 200 or might be fed into other utile devices. It will be clear to those skilled in the art how to make and use one or more utile devices in accordance with the illustrative embodiment of the present invention.

Electrical conductor 211 and electrical conductor 212 can be metal bus lines or specific transistor diffusion nodes, as are well-known in the art, and it will be clear to those skilled in the art how to make and use electrical conductor 211 and electrical conductor 212 in conjunction with utile devices 201-1 through 201-N. It is well-known to those skilled in the art how to make and use integrated circuit 200.

Figure 3:
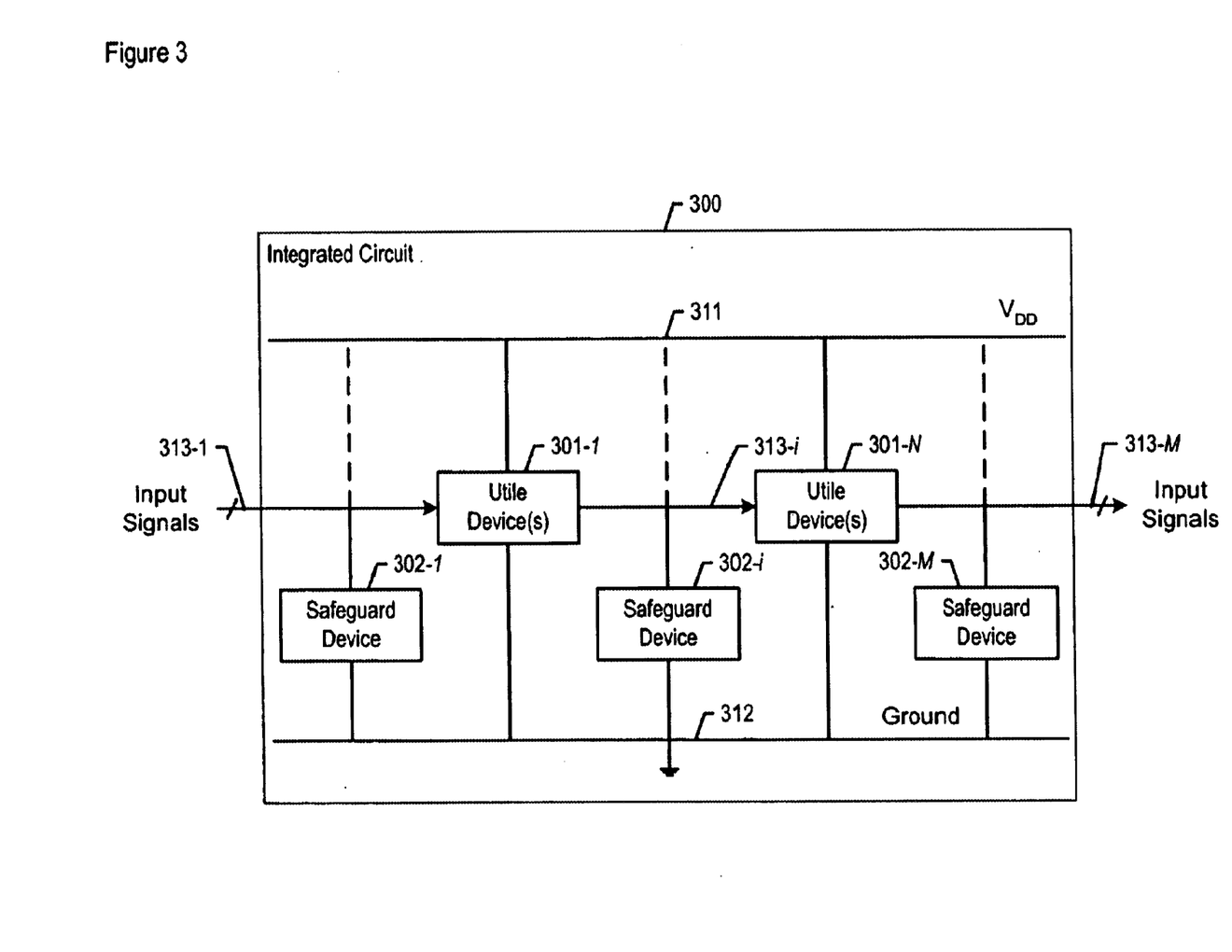
FIG. 3 depicts a block diagram of an integrated circuit in accordance with the illustrative embodiment of the present invention.

FIG. 3 depicts a block diagram of integrated circuit 300 in accordance with the first illustrative embodiment of the present invention. Integrated circuit 300 advantageously comprises a plurality of utile devices, utile devices 301-1 through 301-N, electrical conductors 311 for connecting utile devices 301-1 through 301-N to power, and electrical conductor 312 for connecting utile devices 301-1 through 301-N to ground.

In addition to these elements, however, integrated circuit 200 also advantageously comprises one or more "safeguard devices," such as safeguard devices 302-1 through 302-M. It will be clear to those skilled in the art that integrated circuit 300 can comprise other elements (e.g., pads for receiving power and ground, etc.) than are depicted in FIG. 3, but these are not shown so that attention can be focused on those elements that are germane to an understanding of the present invention.

For the purposes of this specification, a "safeguard device" is defined as a device that is designed to interrupt the functioning of all or part of an integrated circuit when the integrated circuit is exposed to ionizing radiation. In general, the safeguard devices on the integrated circuit do not provide any functionality to the end-user and only exist so that they can completely or partially destroy the functionality of the integrated circuit when the integrated circuit is exposed to ionizing radiation. As a practical matter, most end users would probably prefer that the integrated circuit not contain a safeguard device because the presence of the safeguard device increases the susceptibility of the integrated circuit to failure.

The details of a safeguard device are discussed with respect to FIG. 4 below. Although one lead of a safeguard device is always tied to ground, the other lead can be either connected to power (i.e., $V_{DD}$) or to a signal lead (e.g., signal lead 313-i, etc.). The theory of operation of the illustrative embodiment is as follows: when integrated circuit 300 is exposed to ionizing radiation, a safeguard device shorts its two terminals together. When the safeguard device is connected between power and ground, the safeguard device shorts power to ground. When the safeguard device is connected between the signal lead and ground, the safeguard device shorts the signal lead to ground. In either case, the integrated circuit is affected.

The advantage of placing the safeguard devices between power and ground is that they can completely disable integrated circuit 300 from operating. The disadvantage of placing the safeguard devices between power and ground is that they might also short out all of the integrated circuits in the vicinity of integrated circuit 300.

The advantage of placing the safeguard devices between a signal lead and ground is that they can be used to selectively disable portions integrated circuit 300 from operating. The disadvantage of placing the safeguard devices between a signal lead and ground is that they might not sufficiently degrade the operation of integrated circuit 300.

From reading this specification, it will be clear to those skilled in the art how and where to place the safeguard devices on an integrated circuit to achieve a desire effect.

Electrical conductor 311 and electrical conductor 312 can be metal bus lines or specific transistor diffusion nodes, as are well-known in the art, and it will be clear to those skilled in the art how to make and use electrical conductor 311 and electrical conductor 312 in conjunction with utile devices 301-1 through 301-N, and safeguard devices 302-1 through 302-M.

Figure 4:
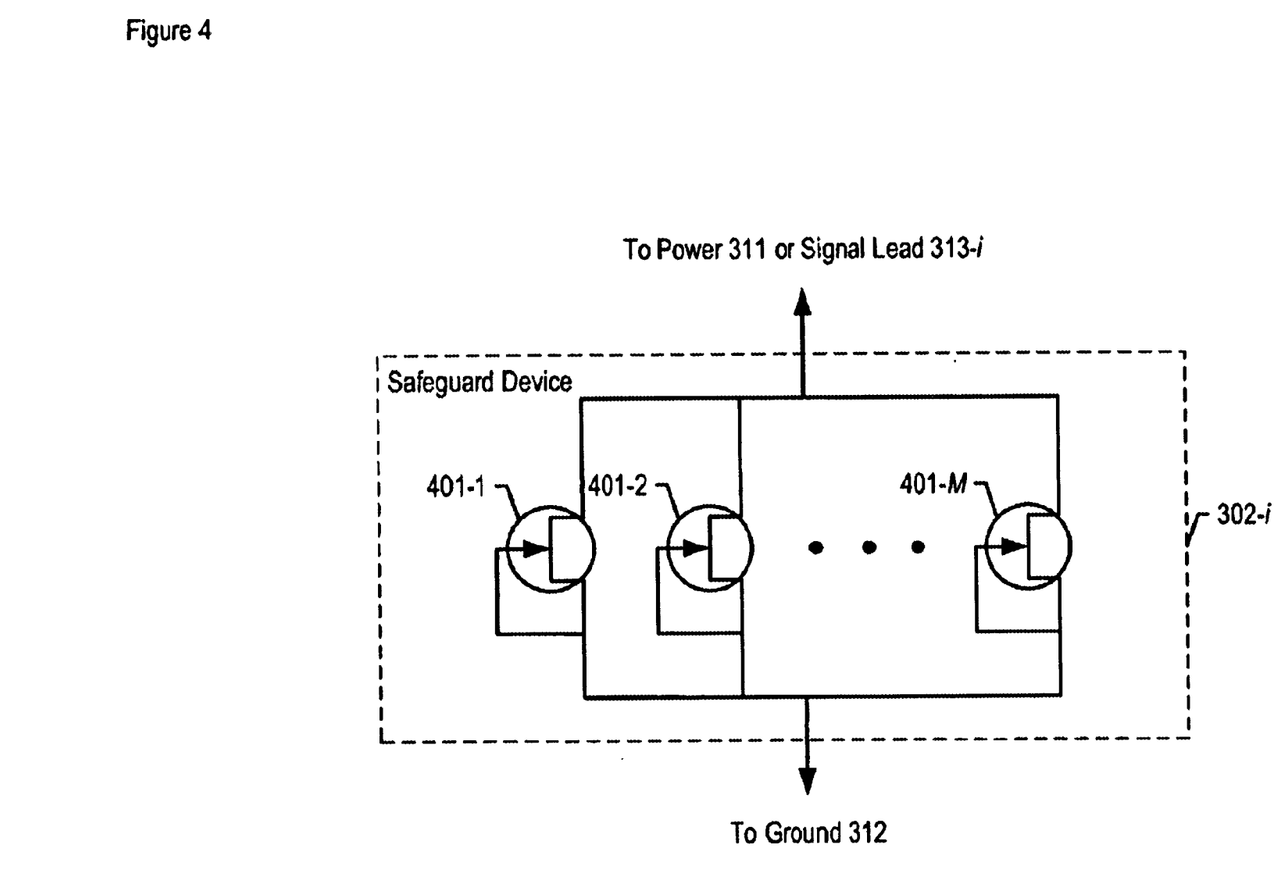
FIG. 4 depicts a schematic diagram of an illustrative safeguard device in accordance with the illustrative embodiment of the present invention.

FIG. 4 depicts a schematic diagram of illustrative safeguard device 302-i, in accordance with the illustrative embodiment of the present invention. Safeguard device 302-i advantageously comprises one or more n-type metal-oxide semiconductor field-effect transistors (i.e., MOSFET) that are ganged in parallel, and so that their gates and sources are electrically connected to ground and so that their drains are electrically connected to either $V_{DD}$ or a signal lead.

This signal lead could be, for example, a chip enable that must have a high voltage in order for integrated circuit 300 to function. In this case, when integrated circuit 300 is exposed to ionizing radiation, safeguard device 302-i shorts and the chip enable is disabled The salient characteristic of safeguard devices 302-1 through 302-M is that they are fabricated so as to be more susceptible to ionizing radiation than the utile devices 301-1 through 301-N, and, in fact, susceptible enough to ionizing radiation to pass the ITAR restrictions. The following commonly-owned, co-pending applications, filed on the same date as this application, teach how to fabricate some transistors on an integrated circuit so that they are more susceptible to ionizing radiation than other devices and susceptible enough to ionizing radiation to pass the ITAR restrictions. These applications are incorporated by reference:

1. "Apparatus and Method for Manufacturing a Semiconductor Circuit," Ser. No. 09/590,809, filed Jun. 9, 2000;
2. "Semiconductor Device and Circuit Having Low Tolerance to Ionizing Radiation," Ser. No. 09/590,806, filed Jun. 9, 2000; and
3. "Semiconductor Circuit Having Increased Susceptibility to Ionizing Radiation," Ser. No. 09/592,473, file Jun. 9, 2000.

Advantageously, each basic cell or group of utile devices is associated with one or more safeguard devices that are capable of preventing at least the associated utile devices from functioning.

To accomplish this:
1. the safeguard devices are advantageously placed near their associated utile devices;
2. the amount of electrical resistance between the safeguard devices and their associated utile devices should be kept to a minimum; and
3. the safeguard devices should be designed and fabricated to have enough current capacity to affect the voltage on whichever of $V_{DD}$ or the signal lead they are attached to.

Figure 5:
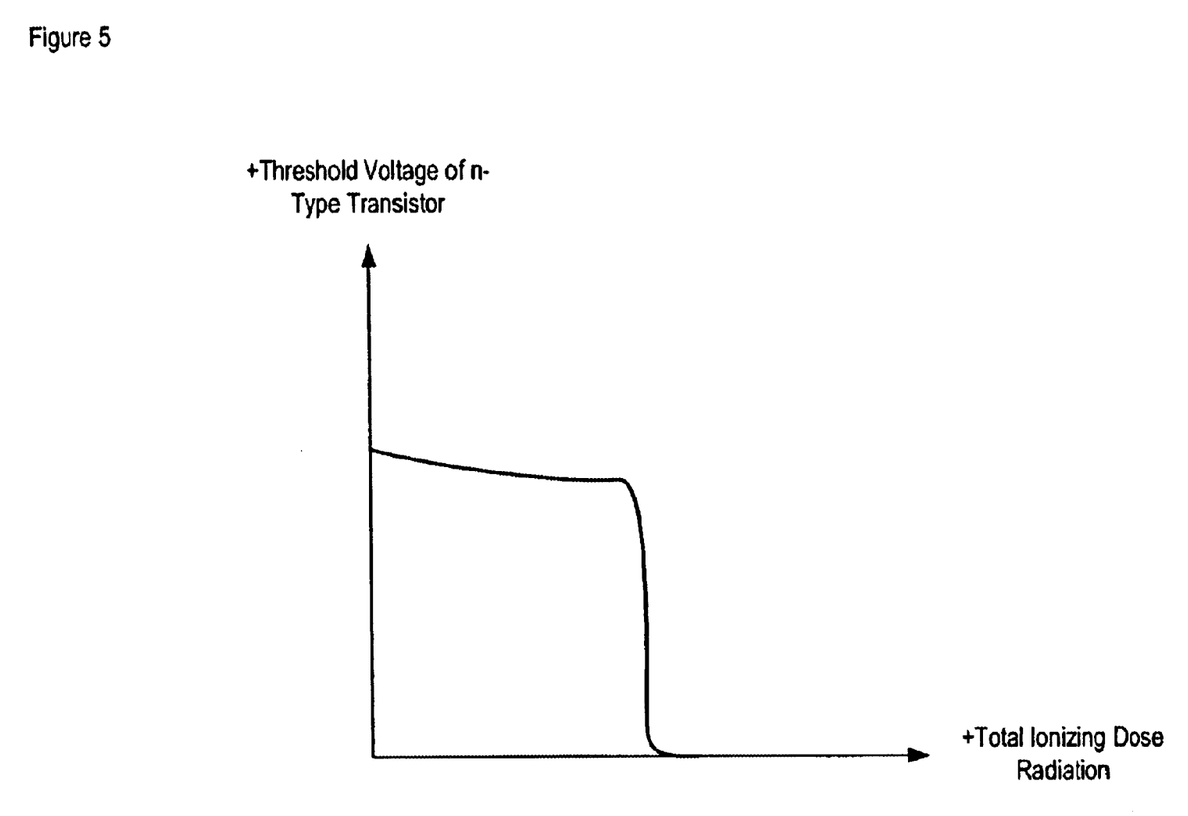
FIG. 5 depicts a graph of the effect of total ionizing dose radiation on the threshold voltage of the safeguard device depicted in FIG. 4.

FIG. 5 depicts a graph of the threshold voltage, $V_T$, of safeguard device 302-i as a function of the amount of total ionizing dose radiation to which integrated circuit 300 has been exposed. In normal operation (i.e., when the total ionizing dose radiation is zero), the threshold voltage is high, the safeguard device is "off" (i.e., an open circuit) and the operation of the utile devices is unaffected. In contrast, when integrated circuit 300 has been exposed to ionizing radiation and the total ionizing dose increases, the threshold voltage eventually drops to the point where the safeguard device turns "on" (i.e., a closed circuit) and the operation of the utile devices is affected. It will be understood to those skilled in the art that the total ionizing dose might occur over an extended period (e.g., days, months, years, etc.).

Figure 6:
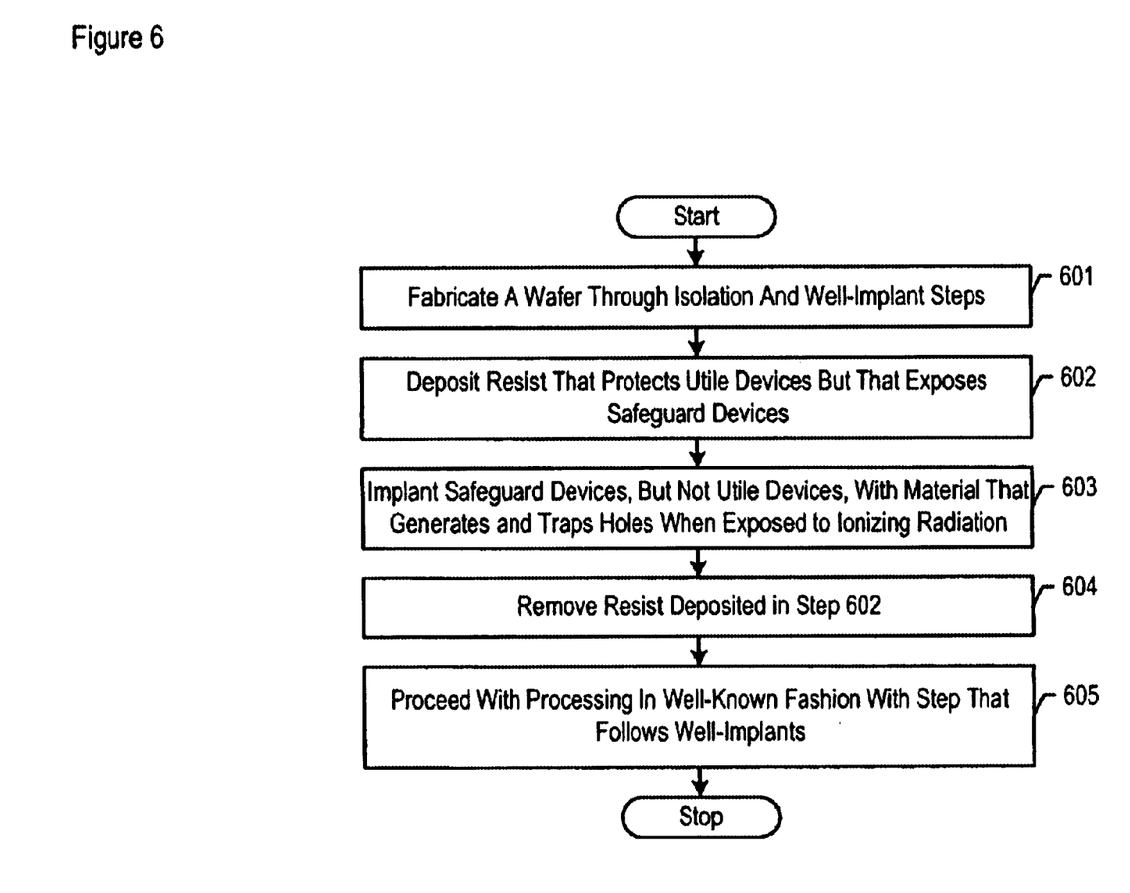
FIG. 6 depicts a flowchart depicting a method of fabricating integrated circuit 300 in accordance with the illustrative embodiment of the present invention.

FIG. 6 depicts a flowchart of the steps involved in making integrated circuit 300 with both utile devices and safeguard devices. In general, three additional steps are involved in making integrated circuit 300 beyond the steps needed to make integrated circuit 200.

At step 601, a wafer comprising a base layer is fabricated in well-known fashion through the isolation and well implant steps with the both the utile devices and safeguard devices on the wafer.

At step 602, a resist is deposited and patterned with a mask that exposes the safeguard devices (including the field oxide and gate dielectric) to the implant in step 603 but that does not expose the utile devices. This is because the safeguard devices are to be affected in such a manner that makes them more susceptible to ionizing radiation that utile devices.

At step 603, a material is accelerated into the base layer at a relatively high dose (e.g., about $1 \times 10^{14}$ to $1 \times 10^{16}/cm^2$) at a relatively low acceleration energy (e.g., about 5 to 5 KeV to form a relatively shallow implant (e.g., about 100 to 1000 Angstroms). The material includes a species that produces damage centers that trap positive charges. The positive charge traps capture positive charges created when ionizing radiation impacts the insulator, such as the field oxide. Species that generate electrons should not, in general, be used. For example, oxygen is a suitable implant species.

Because of the resist added in step 602, only the safeguard devices are affected by this step, and, therefore, this is the step that makes the safeguard devices more sensitive to ionizing radiation and causes the safeguard device's threshold voltage to drop when exposed to ionizing radiation. It will be clear to those skilled in the art how to perform step 602.

At step 604, the resist applied in step 602 is removed in well-known fashion.

At step 605, the process proceeds in well-known fashion with the step following the well implant step.

It is to be understood that the above-described embodiments are merely illustrative of the invention and that many variations may be devised by those skilled in the art without departing from the scope of the invention. It is therefore intended that such variations be included within the scope of the following claims and their equivalents.

What is claimed is:

1. An integrated circuit comprising:
   a first device comprising a first lead, a second lead, and a third lead, wherein said third lead of said first device is electrically connected to ground; and
   a second device comprising a first lead, a second lead, and a third lead, wherein said third lead of said second device is electrically connected to ground, and wherein said first lead of said second device is electrically connected to said first lead of said first device;
   wherein the effective threshold voltage of said first device is more susceptible to be lowered by ionizing radiation than is the effective threshold voltage of said second device; and
   wherein said first device comprises a field oxide that has been implanted with a material that traps positive charge when said first device is exposed to ionizing radiation and said second device has not been implanted with said material.

2. The integrated circuit of claim 1 wherein said first device comprises an n-type metal-oxide semiconductor field-effect transistor.

3. The integrated circuit of claim 1 wherein said integrated circuit further comprises a microprocessor that comprises a control sequencer coupled to an arithmetic logic unit.

4. The integrated circuit of claim 1 wherein said integrated circuit further comprises an arrangement of memory cells operatively coupled to an address decoder.

5. The integrated circuit of claim 1 wherein said first device shorts power to ground when said device has been exposed to ionizing radiation.

6. An integrated circuit comprising:
   a safeguard device comprising a first lead, a second lead, and a third lead, wherein said third lead of said first device is electrically connected to ground; and
   a utile device comprising a first lead, a second lead, and a third lead, wherein said third lead of said second device is electrically connected to ground, and wherein said first lead of said second device is electrically connected to said first lead of said first device;
   wherein upon exposure to a sufficient amount of ionizing radiation, said safeguard device turns on before said utile device, and affects operation of said utile device.

7. The integrated circuit of claim 6 wherein said safeguard device is connected between power and ground, so that, when said safeguard device turns on, it shorts power to ground.

8. The integrated circuit of claim 6 wherein said safeguard device is connected between a signal lead and ground, so that, when said safeguard device turns on, it shorts said signal lead to ground.

9. The integrated circuit of claim 6 said safeguard device comprises an n-type metal-oxide semiconductor field-effect transistor.

* * * * *

UNITED STATES PATENT AND TRADEMARK OFFICE
CERTIFICATE OF CORRECTION

PATENT NO. : 6,794,733 B1
DATED : September 21, 2004
INVENTOR(S) : Brady et al.

It is certified that error appears in the above-identified patent and that said Letters Patent is hereby corrected as shown below:

Title page,
Item [73], Assignee, should be changed from "BAE Systems"
to -- BAE Systems Information and Electronic Systems Integration Inc. --

Signed and Sealed this

Twelfth Day of July, 2005

JON W. DUDAS
*Director of the United States Patent and Trademark Office*